(12) United States Patent
Wang

(10) Patent No.: US 9,666,620 B2
(45) Date of Patent: May 30, 2017

(54) STACKED FILTER AND IMAGE SENSOR CONTAINING THE SAME

(71) Applicant: VisEra Technologies Company Limited, Hsin-Chu (TW)

(72) Inventor: Wei-Ko Wang, Taoyuan County (TW)

(73) Assignee: VisEra Technologies Company Limited, Hsin-Chu (TW)

( * ) Notice: Subject to any disclaimer, the term of this patent is extended or adjusted under 35 U.S.C. 154(b) by 0 days.

(21) Appl. No.: 14/507,339

(22) Filed: Oct. 6, 2014

(65) Prior Publication Data
US 2016/0099272 A1    Apr. 7, 2016

(51) Int. Cl.
| | | |
|---|---|---|
| H01L 27/146 | (2006.01) |
| H01L 31/0232 | (2014.01) |
| H01L 31/00 | (2006.01) |
| H01L 21/00 | (2006.01) |
| G02B 5/22 | (2006.01) |

(52) U.S. Cl.
CPC .......... H01L 27/14621 (2013.01); G02B 5/22 (2013.01); H01L 27/1464 (2013.01); H01L 27/14627 (2013.01); H01L 27/14645 (2013.01); H01L 27/14649 (2013.01); H01L 27/14652 (2013.01); H01L 27/14685 (2013.01)

(58) Field of Classification Search
CPC .......... H01L 27/14621; H01L 27/1464; H01L 27/14645; H01L 27/14649; H01L 27/14652; H01L 27/14685; G02B 5/22
USPC .................................................. 257/435, 432
See application file for complete search history.

(56) References Cited

U.S. PATENT DOCUMENTS

| | | | | |
|---|---|---|---|---|
| 5,801,373 A | * | 9/1998 | Oozu ................ H01L 27/14621 |
| | | | | 250/208.1 |
| 2004/0125222 A1 | * | 7/2004 | Bradski et al. ............... 348/272 |
| 2007/0272836 A1 | * | 11/2007 | Higashitsutsumi et al. .. 250/226 |
| 2008/0251694 A1 | * | 10/2008 | Tanimoto et al. ......... 250/208.1 |

(Continued)

FOREIGN PATENT DOCUMENTS

| | | |
|---|---|---|
| JP | 05-080213 A | 4/1993 |
| JP | 06-342146 | 12/1994 |

(Continued)

OTHER PUBLICATIONS

Office Action mailed May 23, 2016 in related JP Application 2015-051669, with English translation.

(Continued)

*Primary Examiner* — Dzung Tran
(74) *Attorney, Agent, or Firm* — Muncy, Geissler, Olds & Lowe, P.C.

(57) ABSTRACT

A stacked filter for an image sensor including an infrared (IR) pixel is provided. The stacked filter includes a first filter layer disposed at the IR pixel. The first filter layer allows light with wavelengths of a first band to be transmitted through. The stacked filter further includes a second filter layer stacked with the first filter layer. The second filter layer allows light with wavelengths of a second band to be transmitted through. The first band partially overlaps the second band at wavelengths of a third band. The third band is narrower than the first band and the second band. The stacked filter allows light with the wavelengths of the third band to be transmitted through. Furthermore, an image sensor containing a stacked filter is also provided.

20 Claims, 7 Drawing Sheets

(56) References Cited

U.S. PATENT DOCUMENTS

| | | | |
|---|---|---|---|
| 2008/0304156 A1* | 12/2008 | Koyama | 359/588 |
| 2010/0102366 A1 | 4/2010 | Lee et al. | |
| 2010/0201834 A1* | 8/2010 | Maruyama et al. | 348/222.1 |
| 2010/0289885 A1 | 11/2010 | Lu et al. | |
| 2011/0001205 A1* | 1/2011 | Sul et al. | 257/432 |
| 2011/0013055 A1 | 1/2011 | Sul et al. | |
| 2011/0317048 A1* | 12/2011 | Bai et al. | 348/294 |
| 2012/0056073 A1* | 3/2012 | Ahn | 250/208.1 |

FOREIGN PATENT DOCUMENTS

| | | |
|---|---|---|
| JP | 10-065135 A | 3/1998 |
| JP | 2005006066 A | 1/2005 |
| JP | 2005184690 A | 7/2005 |
| JP | 2006010764 A | 1/2006 |
| JP | 2007189376 A | 7/2007 |
| JP | 2008008700 A | 1/2008 |
| JP | 2012137728 A | 7/2012 |
| JP | 2012209913 A | 10/2012 |
| JP | 2013115625 A | 6/2013 |
| WO | WO 2015159651 A1 | 10/2015 |

OTHER PUBLICATIONS

Japanese Office Action dated Feb. 6, 2017, as issued in corresponding Japan Patent Application No. 2015-051669 with English translation (18 pages).

* cited by examiner

STACKED FILTER AND IMAGE SENSOR CONTAINING THE SAME

CROSS REFERENCE TO RELATED APPLICATIONS

This application is related to the following co-pending commonly assigned patent application: U.S. Ser. No. 14/507,315 filed on Oct. 6, 2014, the entire contents of which is hereby incorporated by reference.

BACKGROUND

Field of the Invention

The invention relates to a stacked filter and more particularly to a stacked filter for an image sensor having infrared (IR) pixels integrated with red (R), green (G) and blue (B) pixels together in a single sensor for time-of-flight (ToF) technology application.

Description of the Related Art

Currently, time-of-flight (ToF) technology has been used extensively in modern industries to provide three-dimensional (3D) imaging by using a low-cost complementary metal-oxide semiconductor (CMOS) pixel array together with a modulated light source. 3D ToF cameras are used for many different applications, for example, profile inspection of manufactured goods, computer-aided design (CAD) verification, geographic surveying and object imaging.

A 3D ToF camera works by illuminating the scene with a modulated light source, and observing the reflected light. The phase shift between the illumination and the reflection is measured and translated into distance. Typically, the illumination is from a solid-state laser or a light-emitting diode (LED) operating in the near-infrared range of about 850 nm, invisible to the human eye. An image sensor designed to respond to the same spectrum of the modulated light source receives the light and converts the photonic energy to electrical current to obtain distance (depth) information of the scene.

In general, a filter is disposed in front of the image sensor to obtain a better signal-to-noise ratio (SNR) of the distance (depth) information. The conventional filter is usually fabricated by a multi-film interference technology. When a large inclined incident light falls on the conventional filter, a blue-shifting always occurs at the conventional filter and causes the spectrum of the conventional filter toward a lower wavelength band. Therefore, the image sensors containing the conventional filter require a telecentric lens with 0° or small chief ray angle (CRA) to overcome the blue-shifting caused by large inclined incident light.

BRIEF SUMMARY

The disclosure provides image sensors having red (R), green (G) and blue (B) pixels and infrared (IR) pixels integrated together in a single image sensor. The disclosure further provides a stacked filter for each IR pixel of the image sensors. The stacked filter allows IR light with wavelengths of a narrow band to be transmitted through. Thus, photodiodes of the image sensors at the IR pixels receive the IR light with the wavelengths of the narrow band to obtain a better signal-to-noise ratio (SNR) of distance (depth) information of an object.

According to some embodiments, a stacked filter for an image sensor including an infrared (IR) pixel is provided. The stacked filter comprises a first filter layer disposed at the IR pixel. The first filter layer allows light with wavelengths of a first band to be transmitted through. The stacked filter further comprises a second filter layer stacked with the first filter layer. The second filter layer allows light with wavelengths of a second band to be transmitted through. A portion of the second band is lower than the first band. The first band partially overlaps the second band at wavelengths of a third band. The third band is narrower than the first band and the second band. The stacked filter allows light with the wavelengths of the third band to be transmitted through.

According to some embodiments, an image sensor is provided. The image sensor comprises a red (R) pixel, a green (G) pixel, a blue (B) pixel and an infrared (IR) pixel. The image sensor further comprises R, G and B filters respectively disposed at the R, G and B pixels. The image sensor also comprises an IR filter stacked with the R, G and B filters. The IR filter cuts off at least IR light with a specific wavelength. In addition, the image sensor comprises a stacked filter disposed at the IR pixel. The stacked filter comprises a first filter layer disposed at the IR pixel and a second filter layer stacked with the first filter layer. The first filter layer allows light with wavelengths of a first band to be transmitted through. The second filter layer allows light with wavelengths of a second band to be transmitted through. A portion of the second band is lower than the first band. The first band partially overlaps the second band at wavelengths of a third band. The third band is narrower than the first band and the second band. The stacked filter allows light with the wavelengths of the third band to be transmitted through.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION

The following description is the contemplated mode of carrying out the disclosure. This description is made for the purpose of illustrating the general principles of the disclosure and should not be taken in a limiting sense. The scope of the disclosure is best determined by reference to the appended claims.

Figure 1:
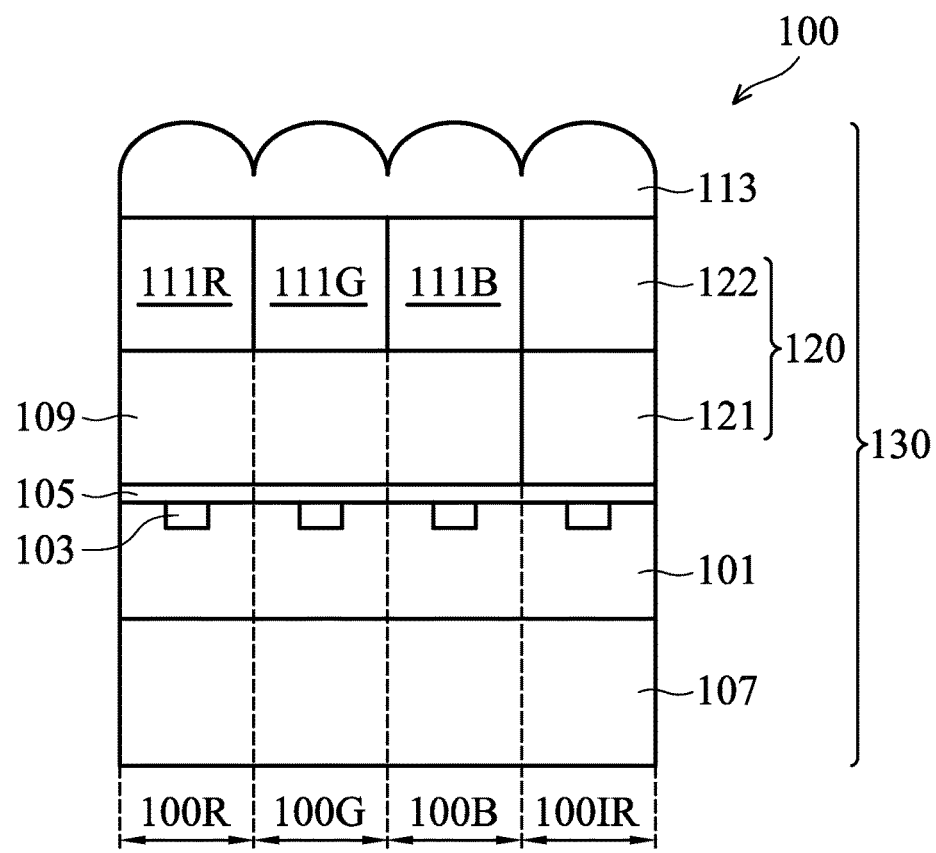
FIG. 1 is a schematic cross section of a portion of an image sensor according to some embodiments.
Figure 2:
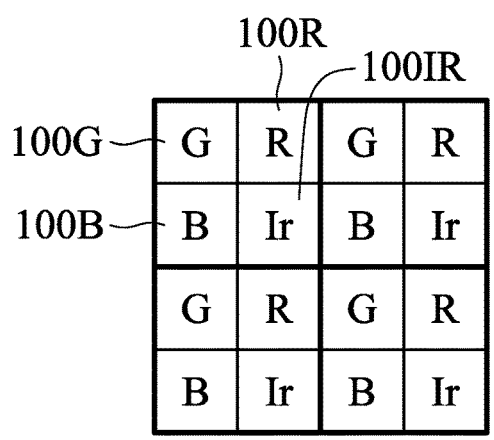
FIG. 2 is a plane view of an arrangement of R, G, B and IR pixels of an image sensor according to some embodiments.

Referring to FIG. 1, a cross section of a portion of a backside illumination (BSI) image sensor 100 according to some embodiments is shown. The image sensor 100 has multiple pixels of red (R) pixels 100R, green (G) pixels 100G, blue (B) pixels 100B and infrared (IR) pixels 100IR arranged in order to form a pixel array. FIG. 2 is a plane view of an arrangement of the R, G, B and IR pixels, 100R, 100G, 100B and 100IR, of the image sensor 100 according to some embodiments. As shown in FIG. 2, in a Bayer pattern of the R, G, B and IR pixels, 100R, 100G, 100B and 100IR, the position of one G pixel is replaced with an IR pixel.

As shown in FIG. 1, the image sensor 100 includes a semiconductor substrate 101 containing multiple photodiodes 103 formed therein. Each of the photodiodes 103 is disposed at one pixel of the red (R) pixels 100R, the green (G) pixels 100G, the blue (B) pixels 100B and the infrared (IR) pixels 100IR. The image sensor 100 further includes a wiring layer 107 formed on a surface of the semiconductor substrate 101. In the BSI image sensors 100, the wiring layer 107 is disposed under the photodiodes 103. The wiring layer 107 consists of several metal layers and several dielectric layers disposed between the metal layers. The metal layers and the dielectric layers can be formed by semiconductor integrated circuit processing technology known in the art. In order to simplify the diagram, the metal layers and the dielectric layers are not depicted in FIG. 1. The wiring layer 107 includes multiple circuit areas and each of the circuit areas corresponds to one photodiode 103. In some embodiments, the image sensor 100 can be a CMOS image sensor (CIS) with the R, G, B and IR pixels integrated together in a single image sensor.

Figure 3:
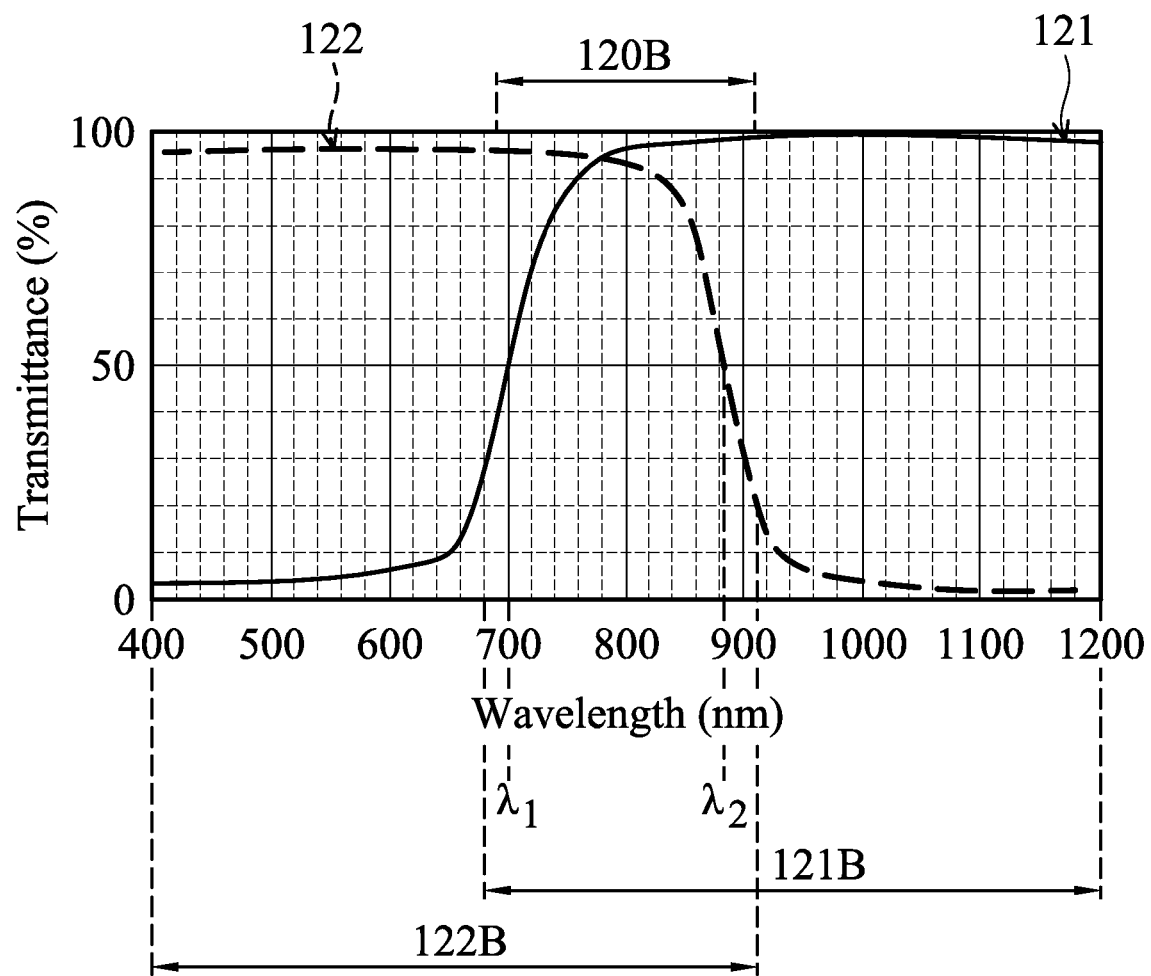
FIG. 3 is a graph of transmittance against wavelength to illustrate the optical characteristics of a first filter layer and a second filter layer of a stacked filter according to some embodiments.

According to some embodiments, the image sensor 100 includes a stacked filter 120 disposed at the IR pixel 100IR. The stacked filter 120 includes a first filter layer 121 stacked with a second filter layer 122. Referring to FIG. 3, a graph of transmittance against wavelength to illustrate the optical characteristics of a first filter layer 121 and a second filter layer 122 of a stacked filter 120 according to some embodiments is shown. The first filter layer 121 allows light with wavelengths of a first band 121B to be transmitted through. The second filter layer 122 allows light with wavelengths of a second band 122B to be transmitted through. The light to be transmitted through the first filter layer 121 has a transmittance of 50% at a first wavelength $\lambda_1$. The light to be transmitted through the second filter layer 122 has a transmittance of 50% at a second wavelength $\lambda_2$. The first wavelength $\lambda_1$ is lower than the second wavelength $\lambda_2$. The wavelength range of 400 nm to 1200 nm as shown in FIG. 3 is an example to illustrate the first band 121B, the second band 122B, the first wavelength $\lambda_1$ and the second wavelength $\lambda_2$ of the first filter layer 121 and the second filter layer 122, and is not to limit the values of the first band 121B, the second band 122B, the first wavelength $\lambda_1$ and the second wavelength $\lambda_2$.

Furthermore, as shown in FIG. 3, a portion of the second band 122B is lower than the first band 121B in wavelengths. The first band 121B partially overlaps the second band 122B at wavelengths of a third band 120B. The third band 120B is narrower than the first band 121B and the second band 122B. Therefore, the stacked filter 120, consisting of the first filter layer 121 and the second filter layer 122, allows light with the wavelengths of the third band 120B to be transmitted through. The third band 120B can be a narrow IR band. In other words, the stacked filter 120 can be a narrow-band IR-pass filter. Thus, after light having passed through the stacked filter 120, an IR light with a wavelength of a narrow band, for example an IR light at 850 nm, is received by the photodiodes 103 at the IR pixels 100IR of the image sensor 100 (as shown in FIG. 1). A better signal-to-noise ratio (SNR) of distance (depth) information of an object is thereby obtained for 3D imaging.

According to the embodiments, the first filter layer 121 with the broad first band 121B and the second filter layer 122 with the broad second band 122B can be made of dye or pigment materials which have the spectrum distributions of the first and second bands 121B and 122B. In other words, the stacked filter 120 can be a double-layered stacked absorption-type filter formed from the combination of the first and second filter layers 121 and 122. Moreover, the double-layered stacked absorption-type filter made of dye or pigment materials is almost angle-independent. Therefore, the stacked filter 120 of the double-layered stacked absorption-type filter can avoid a Blue-shift occurring under multifilm interference filter application while a large inclined incident light irradiates onto the image sensors 100. In other words, the image sensors of the embodiments do not need a telecentric lens with 0° or small CRA. The telecentric lens with 0° CRA is usually used for image sensors with a filter fabricated by a multi-film interference technology in ToF 3D imaging.

Referring to FIG. 1 again, in some embodiments, the image sensor 100 also includes a passivation film 105 formed on another surface of the semiconductor substrate 101 and disposed above the photodiodes 103. In some other embodiments, the image-sensor device unit 100 may also include a light-shielding partition layer, a high dielectric-constant film and another passivation film formed above the semiconductor substrate 101. In addition, the image sensor 100 includes an R filter 111R, a G filter 111G and a B filter 111B disposed at the R, G and B pixels, 100R, 100G and 100B, respectively. The image sensor 100 further includes an IR filter 109 disposed at the R, G and B pixels, 100R, 100G and 100B. The IR filter 109 is stacked with the R, G and B filters, 111R, 111G and 111B. The IR filter 109 cuts off at least IR light with a specific wavelength.

Figure 4:
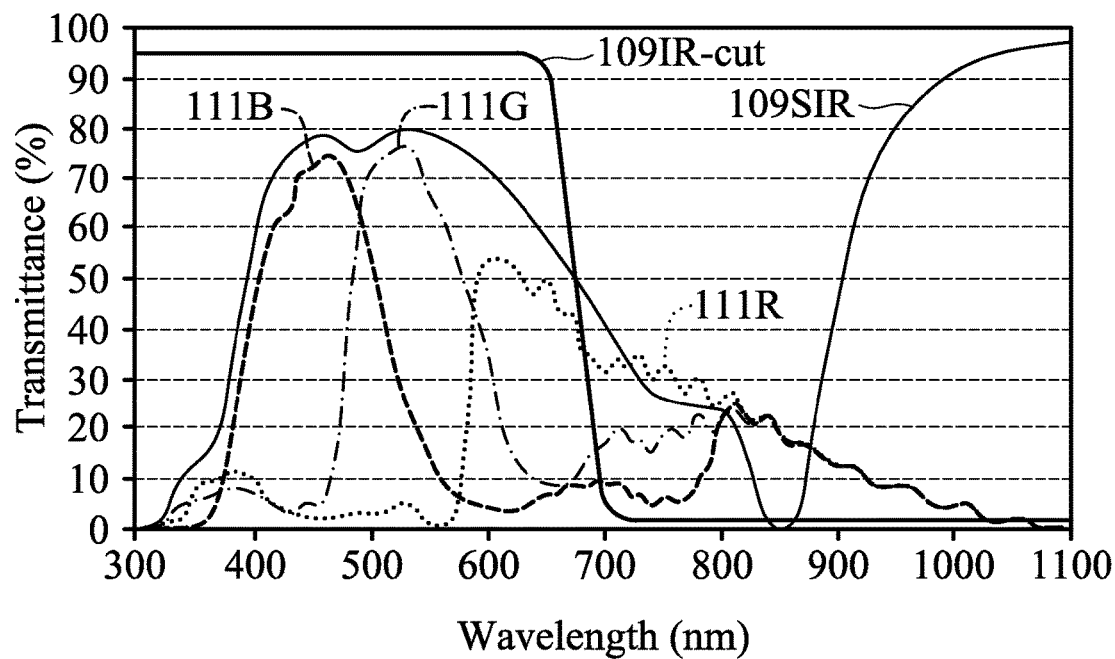
FIG. 4 is a graph of transmittance against wavelength to illustrate the optical characteristics of an R filter, a G filter, a B filter, a selective IR filter, and an IR cut-off filter, respectively, of an image sensor according to some embodiments.

In some embodiments, the IR filter 109 can be a selective IR filter which only cuts off IR light with the specific wavelength. In some other embodiments, the IR filter 109 can be an IR cut-off filter which can cut off IR light with wavelengths of the entire IR band. Referring to FIG. 4, a graph of transmittance against wavelength to illustrate the optical characteristics of an R filter 111R, a G filter 111G, a B filter 111B, a selective IR filter 109SIR, and an IR cut-off filter 109IR-cut, respectively, of an image sensor according to some embodiments is shown. The spectrums of the R, G and B filters, 111R, 111G and 111B, have transmittances at the wavelengths in an IR band of 700 nm to 1100 nm. Thus, IR light with the wavelengths of the IR band of 700 nm to 1100 nm can be transmitted through the R, G and B filters, 111R, 111G and 111B. If the IR light having passed through the R, G and B filters, 111R, 111G and 111B is received by the photodiodes 103 at the R, G and B pixels, a signal-to-noise ratio (SNR) of color imaging information of an object will be reduced.

As shown in FIG. 4, the spectrum of the selective IR filter 109SIR disposed at the R, G and B pixels has a transmittance of about 0% at a specific wavelength in an IR band, for example, at 850 nm. The specific wavelength of the selective IR filter 109SIR is consistent with the wavelength of a specific band of IR light of a light source unit which is configured in the image sensor to radiate the IR light onto an object. Thus, the selective IR filter 109SIR can cut off the IR light of the light source unit, which has passed through the R, G and B filters, 111R, 111G and 111B, to enhance the SNR of color imaging information of an object.

In addition, as shown in FIG. 4, the spectrum of the IR cut-off filter 109IR-cut has a transmittance of about 0% at wavelengths in an IR band, for example, from 700 nm to 1100 nm. Thus, the IR cut-off filter 109IR-cut, disposed at the R, G and B pixels, can also cut off the IR light of the light source unit which has passed through the R, G and B filters, 111R, 111G and 111B, to enhance the SNR of color imaging information of an object.

Therefore, in the embodiments of FIG. 1, the R, G and B filters, 111R, 111G and 111B combined with the IR filter 109 allows R, G and B lights with wavelengths in visible band to be transmitted through and cuts off at least IR light with a specific wavelength which is consistent with the wavelength of IR light of a light source unit configured in the image sensor 100. Therefore, there is no or low IR light received by the photodiodes 103 at the R, G and B pixels of the image sensor 100. The R, G and B signals are generated from the photodiodes 103 at the R, G and B pixels without an IR signal noise. The signal-to-noise ratio (SNR) at the R, G and B pixels of the image sensor is thereby enhanced. The light source unit configured in the image sensor 100 to radiate IR light onto an object will be illustrated later in FIG. 5.

Figure 5:
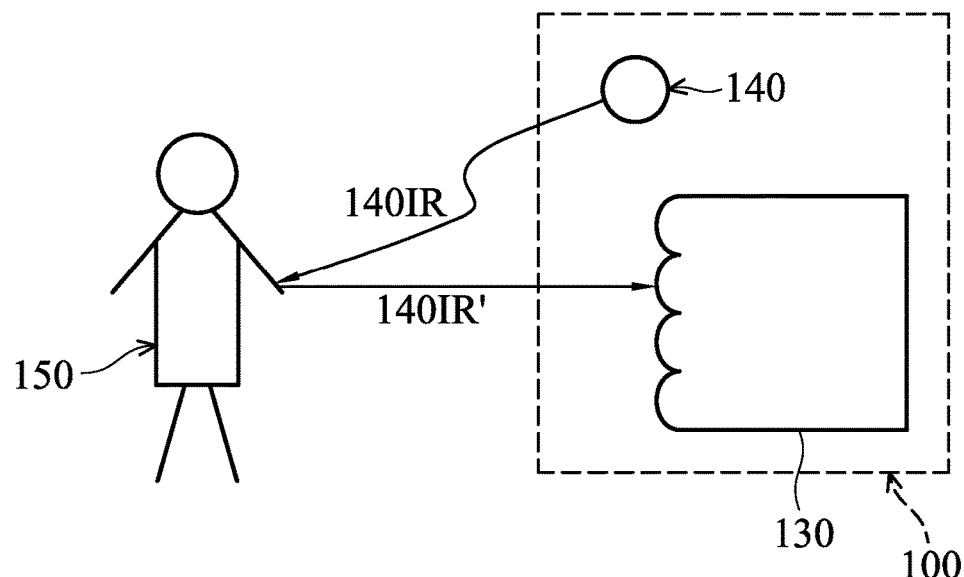
FIG. 5 is a diagram illustrating the configuration of an image sensor for imaging an object according to some embodiments.

As shown in FIG. 1 again, the image sensor 100 further includes a microlens structure 113 disposed on the R, G and B filters, 111R, 111G and 111B and the stacked filter 120. The elements of the image sensor 100 illustrated in FIG. 1 including the microlens structure 113 can be referred to as an image-sensor device unit 130. Referring to FIG. 5, a diagram illustrating the configuration of the image sensor 100 for imaging an object 150 according to some embodiments of the disclosure is shown. As shown in FIG. 5, the image sensor 100 further includes a light source unit 140 configured to radiate an IR light 140IR with a wavelength of a specific band onto the object 150. In some embodiments, the light source unit 140 can be a LED operating in the near-infrared range of about 850 nm. In some embodiments, the specific wavelength of the IR light cut off by the selective IR filter 109SIR, as shown in FIG. 4, is consistent with the wavelength of the specific band of the IR light 140IR from the light source unit 140. In other words, the specific wavelength the IR light cut off by the selective IR filter 109SIR can be about 850 nm.

As shown in FIG. 5, an IR light 140IR' is reflected by the object 150 to the image-sensor device unit 130. According to the embodiments, the stacked filter 120 of the image-sensor device unit 130 allows light with a wavelength of a narrow band to be transmitted through. The wavelength of the narrow band of the stacked filter 120 is consistent with the wavelength of the specific band of the IR lights 140IR and 140IR'. Therefore, it is not necessary for a double band pass filter to be disposed above the microlens structure 113 of the image-sensor device unit 130. The double band pass filter is usually used for allowing visible light and IR light with a specific wavelength that is consistent with the wavelength of the IR light of the light source unit to be transmitted through.

Referring to FIG. 1 and FIG. 5, the IR light 140IR' reflected by the object 150 can pass through the stacked filter 120 and be received by the photodiode 103 at the IR pixel 100IR to generate an IR signal with a better SNR for acquiring distance (depth) information of the object 150. Although it is not shown in FIG. 5, visible light from natural light or another light source is also reflected by the object 150 and then radiates toward the image-sensor device unit 130. The reflected visible light is transmitted through the R, G and B filters, 111R, 111G and 111B, and the IR filter 109 and received by the photodiode 103 at the R, G and B pixels to obtain color image information of the object 150. Moreover, the IR filter 109 disposed at the R, G and B pixels can cut off at least IR light with a specific wavelength that is consistent with the wavelength of the IR lights 140IR and 140IR' of the light source unit 140. Thus, the IR filter 109 stacked with the R, G and B filters, 111R, 111G and 111B can help the photodiodes 103 at the R, G and B pixels receive visible light to generate R, G and B signals of a high SNR for acquiring color image information of an object. The R, G and B signals are generated from the photodiodes 103 at the R, G and B pixels without an IR signal noise.

Figure 6:
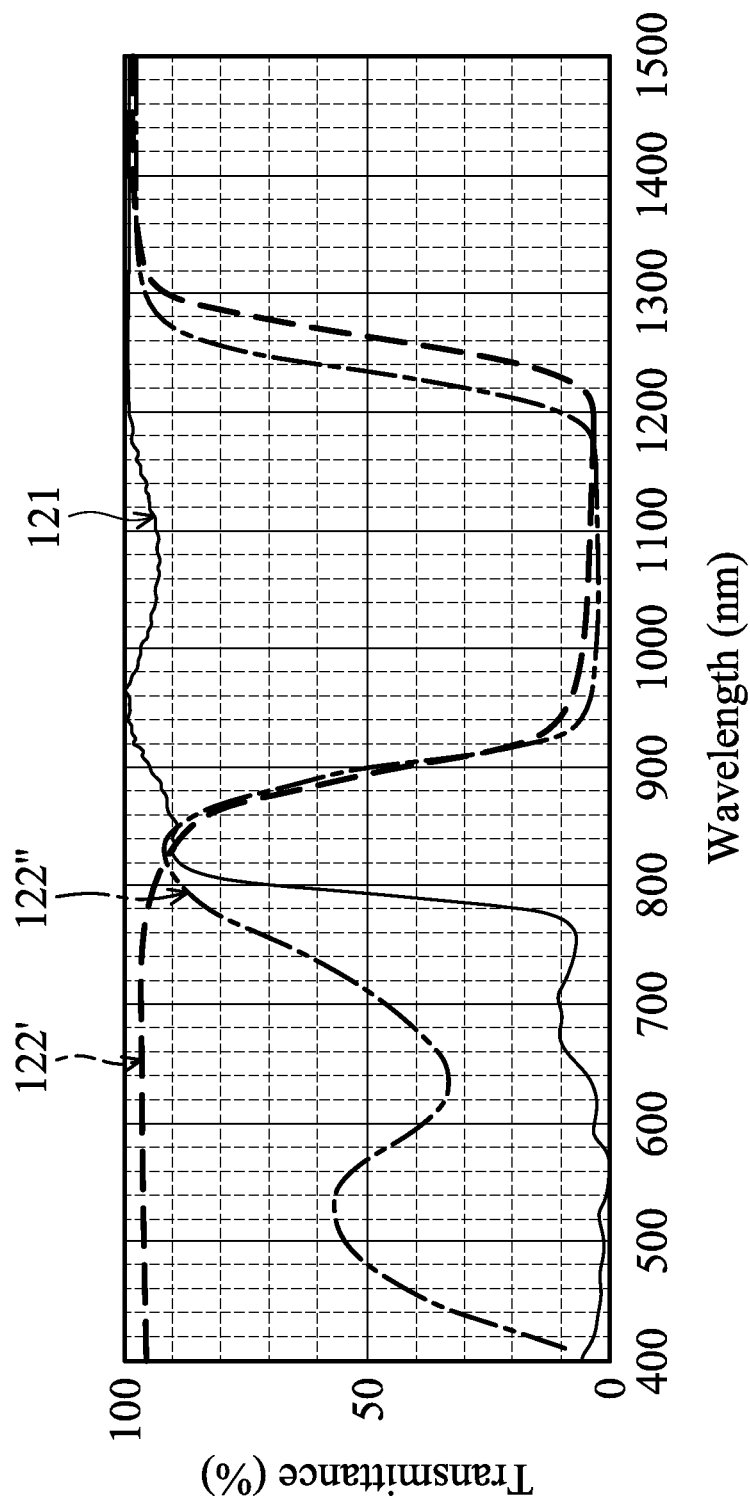
FIG. 6 is a graph of transmittance against wavelength to illustrate the optical characteristics of a first filter layer and two kinds of a second filter layer of a stacked filter according to some embodiments.

Referring to FIG. 6, a graph of transmittance against wavelength to illustrate the optical characteristics of a first filter layer 121 and two kinds of second filter layers 122' and 122" of a stacked filter 120 according to some embodiments is shown. The first filter layer 121 can be referred to as an IR pass filter 121. The second filter layers 122' and 122" can be referred to as partial IR cut-off filters 122' and 122". In some embodiments, the IR pass filter 121 allows IR light with wavelengths of the IR band to be transmitted through. In some other embodiments, as shown in FIG. 6, the IR pass filter 121 allows IR light with wavelengths of an IR band, for example from about 800 nm to about 1200 nm, to be transmitted through. In other words, in some embodiment, the wavelengths of the first band 121B (as shown in FIG. 3) of the first filter layer (or the IR pass filter) 121 may be from about 800 nm to about 1200 nm.

The partial IR cut-off filters 122' and 122" have a cut-off region from a third wavelength to a fourth wavelength. The third wavelength is the specific wavelength (about 850 nm) of the IR light of the light source unit plus about 10-50 nm. The fourth wavelength is a longest wavelength of an absorption band of the semiconductor substrate 101. In some embodiments, the semiconductor substrate 101 can be a Si wafer and the longest wavelength of the absorption band of Si wafer is about 1100 nm. In some embodiments, the semiconductor substrate 101 may be made of another suitable semiconductor material, which may have a longest wavelength of an absorption band above 1100 nm, for example 1200 nm. Thus, in some embodiments, the second filter layer (or the partial IR cut-off filter) 122' and 122" have a cut-off region from about 900 nm (850 nm plus 50 nm) to about 1100 nm. As shown in FIG. 6, in some embodiments, the partial IR cut-off filters 122' and 122" have a cut-off region from about 900 nm to about 1200 nm. In other words, the wavelengths of the second band 122B (as shown in FIG. 3) of the second filter layer (or the partial IR cut-off filter) 122' or 122" may be from about 400 nm to about 900 nm. Therefore, in some embodiments, the wavelengths of the third band of the stacked layer 120 may be from about 800 nm to about 900 nm.

Moreover, as shown in FIG. 6, the partial IR cut-off filters 122' and 122" can have different spectrums at the wavelengths from 400 nm to 900 nm, but have the same spectrum at the wavelengths from 900 nm to 1200 nm. In addition, the spectrums of the partial IR cut-off filters 122' and 122" can have a transmittance greater than 0% at the wavelengths of above 1200 nm.

Figure 7:
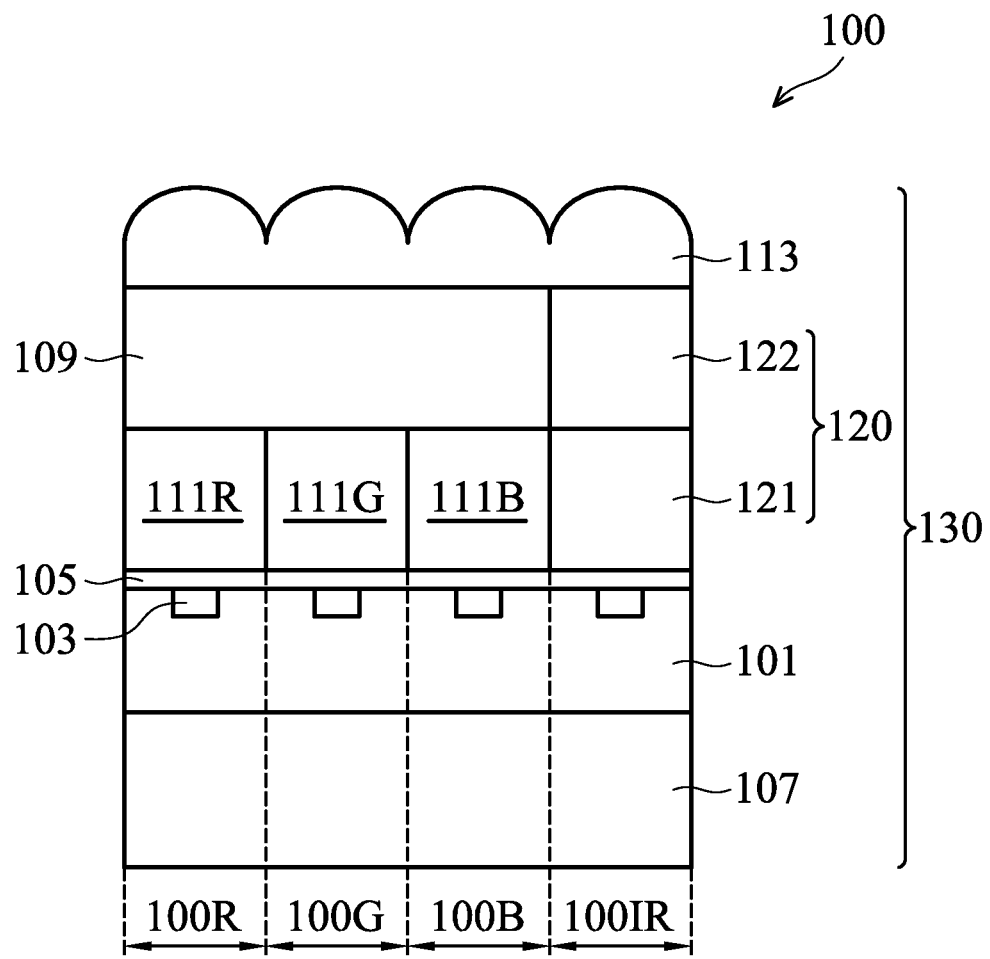
FIGS. 7-9 are schematic cross sections of a portion of an image sensor according to some other embodiments.

Referring to FIG. 7, a cross section of a portion of an image sensor 100 according to some other embodiments is shown. The difference between FIG. 7 and FIG. 1 is that the R, G and B filters 111R, 111G and 111B of FIG. 7 are disposed underneath the IR filter 109. In the embodiment of FIG. 7, the IR filter 109 disposed above the R, G and B filters 111R, 111G and 111B has a filter function the same as that of the IR filter 109 disposed underneath the R, G and B filters 111R, 111G and 111B of FIG. 1.

Figure 8:
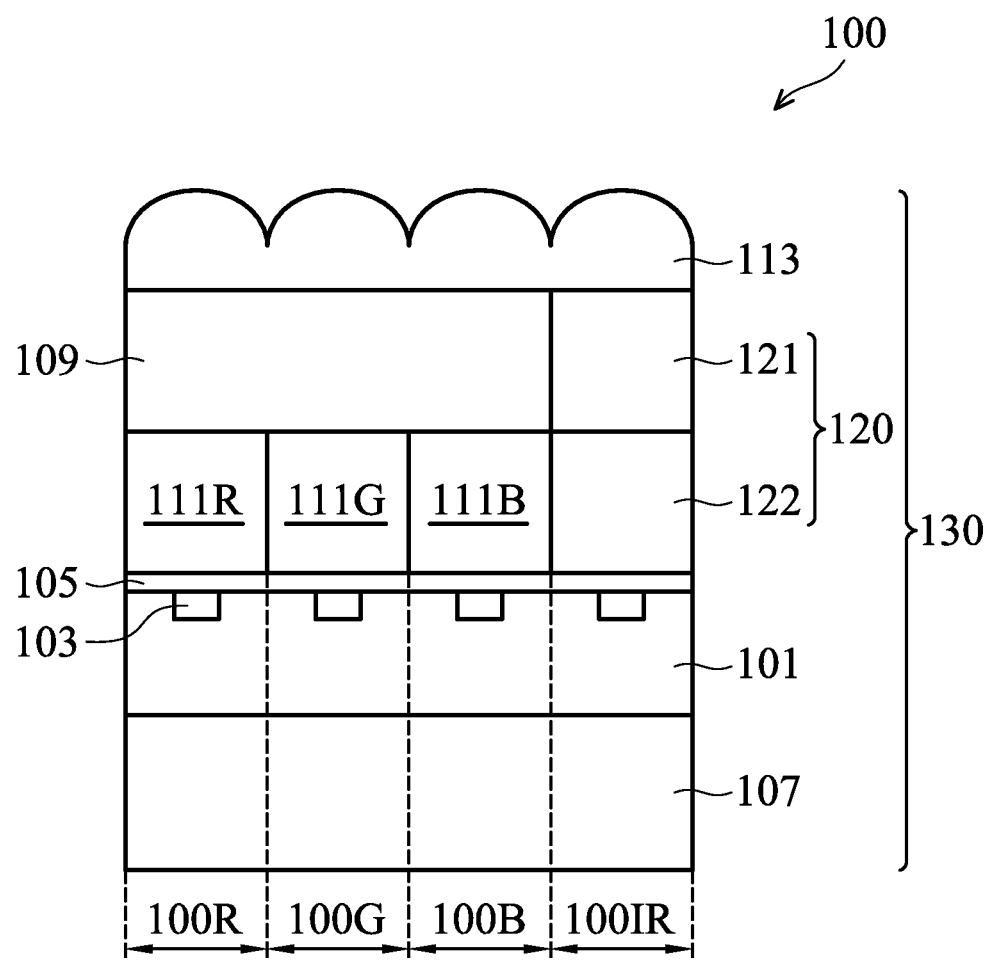

Referring to FIG. 8, a cross section of a portion of an image sensor 100 according to some other embodiments is shown. The difference between FIG. 8 and FIG. 7 is that the first filter layer 121 is disposed above the second filter layer 122 in the stacked filter 120. In the embodiment of FIG. 8, the first filter layer 121 disposed above the second filter layer 122 has a filter function the same as that of the first filter layer 121 stacked underneath the second filter layer 122 of FIG. 1 and FIG. 7.

Figure 9:
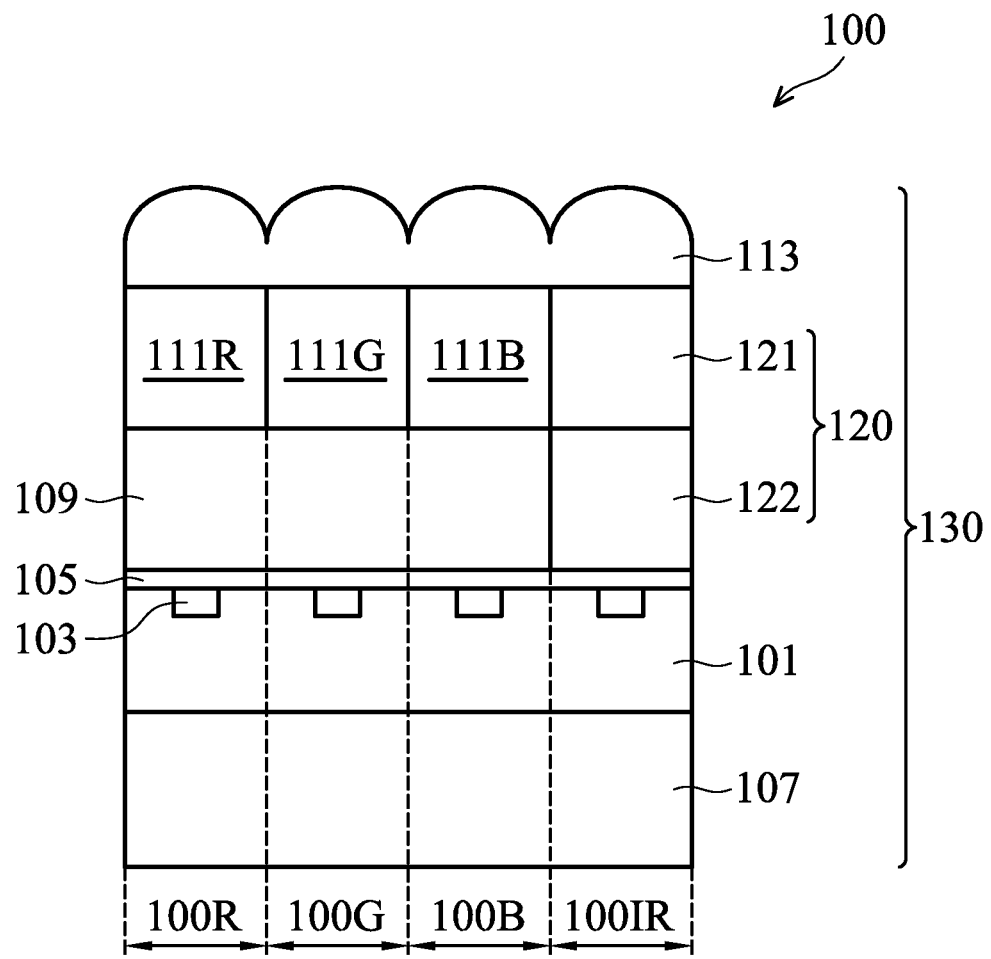

Referring to FIG. 9, a cross section of a portion of an image sensor 100 according to some other embodiments is shown. The difference between FIG. 9 and FIG. 1 is that the first filter layer 121 is disposed above the second filter layer 122 in the stacked filter 120. In the embodiment of FIG. 9, the first filter layer 121 disposed above the second filter layer 122 has a filter function the same as that of the first filter layer 121 stacked underneath the second filter layer 122 of FIG. 1 and FIG. 7.

In the embodiments of FIG. 1 and FIGS. 7-9, the image sensors 100 are backside illumination (BSI) image sensors. In some other embodiments, the image sensors of the disclosure can be front-side illumination (FSI) image sensors. In the FSI image sensors, the wiring layer 107 of FIG. 1 and FIGS. 7-9 is transferred to be disposed above the photodiodes 103. The other elements of the FSI image sensors, such as the passivation film 105, the IR filter 109, the R, G and B filters, 111R, 111G and 111B, the stacked filter 120, and the microlens structure 113 can be the same as that of the BSI image sensors 100 of FIG. 1 and FIGS. 7-9.

According to the embodiments, the stacked filter consisting of the first and second filter layers is disposed at IR pixels of the image sensors. The stacked filter allows IR light with a wavelength of a narrow band to be transmitted through. Thus, IR light with the wavelength of the narrow band is received by the photodiodes at the IR pixels to generate an IR signal with a better SNR. Furthermore, the embodiments of the disclosure do not require a double band pass filter with the spectrum of visible band and a narrow IR band to be disposed above the microlens structure of the image sensors. Besides, in the embodiments of the disclosure, the image sensors do not require a telecentric lens with 0° or small chief ray angle (CRA) to be disposed above the microlens structure.

Moreover, the stacked filter of the embodiments is a double-layered stacked absorption-type filter consisting of the first and second filter layers made from dye or pigment materials. Thus, the stacked filter of the embodiments is easy to fabricate and is angle-independent. Therefore, the stacked filter of the embodiments can avoid Blue-shift while a large inclined incident light irradiates onto the image sensors.

While the disclosure has been described by way of example and in terms of the embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A stacked filter for an image sensor including an infrared (IR) pixel, comprising:
   a first filter layer disposed at the IR pixel, allowing light with wavelengths of a first band to be transmitted through; and
   a second filter layer stacked with the first filter layer, allowing light with wavelengths of a second band to be transmitted through,
   wherein a portion of the second band is lower than the first band, the first band partially overlaps the second band at a third band, the third band is narrower than the first band and the second band, and the stacked filter allows light with the wavelengths of the third band to be transmitted through, and the first band is from a first wavelength to a second wavelength, the second band is from a third wavelength to a fourth wavelength, and the third band is from the first wavelength to the fourth wavelength.

2. The stacked filter as claimed in claim 1, wherein the light to be transmitted through the first filter layer has a transmittance of 50% at a fifth wavelength, the light to be transmitted through the second filter layer has a transmittance of 50% at a sixth wavelength, and the fifth wavelength is lower than the sixth wavelength.

3. The stacked filter as claimed in claim 1, wherein the first and second filter layers are combined to form a double-layered stacked absorption-type filter.

4. The stacked filter as claimed in claim 1, wherein the first filter layer is an infrared (IR) pass filter, the second filter layer is a partial IR cut-off filter, and the IR pass filter allows IR light with wavelengths of the IR band to be transmitted through.

5. The stacked filter as claimed in claim 4, wherein the image sensor is formed on a semiconductor substrate and the image sensor comprises a light source unit configured to radiate IR light with a wavelength of a specific band onto an object, the partial IR cut-off filter has a cut-off region from the fourth wavelength to the second wavelength, the fourth wavelength is the wavelength of the specific band of the IR light of the light source unit plus 10 nm to 50 nm, and the second wavelength is a longest wavelength of an absorption band of the semiconductor substrate.

6. The stacked filter as claimed in claim 1, wherein the wavelengths of the first band of the first filter layer is from 800 nm to 1200 nm, the wavelengths of the second band of the second filter layer is from 400 nm to 900 nm and the wavelengths of the third band of the stacked filter is from 800 nm to 900 nm.

7. The stacked filter as claimed in claim 1, wherein the second filter layer is disposed above the first filter layer.

8. The stacked filter as claimed in claim 1, wherein the second filter layer is disposed underneath the first filter layer.

9. An image sensor, comprising:
   a red (R) pixel, a green (G) pixel, a blue (B) pixel and an infrared (IR) pixel;
   R, G and B filters respectively disposed at the R, G and B pixels;
   an IR filter stacked with the R, G and B filters, wherein the IR filter cuts off at least IR light with a specific wavelength; and
   a stacked filter disposed at the IR pixel, wherein the stacked filter comprises:
   a first filter layer allowing light with wavelengths of a first band to be transmitted through; and
   a second filter layer, stacked with the first filter layer, allowing light with wavelengths of a second band to be transmitted through, wherein a portion of the second band is lower than the first band, the first band partially overlaps the second band at a third band, the third band is narrower than the first band and the second band, and the stacked filter allows light with the wavelengths of the third band to be transmitted through, and the first band is from a first wavelength to a second wavelength, the second band is from a third wavelength to a fourth wavelength, and the third band is from the first wavelength to the fourth wavelength.

10. The image sensor as claimed in claim 9, further comprising a light source unit configured to radiate IR light with a wavelength of a specific band onto an object, wherein the wavelengths of the third band of the stacked filter is consistent with the wavelength of the specific band of the IR light of the light source unit.

11. The image sensor as claimed in claim 9, wherein the first filter layer is an IR pass filter, the second filter layer is a partial IR cut-off filter, and the IR pass filter allows IR light with wavelengths from 800 nm to 1200 nm to be transmitted through.

12. The image sensor as claimed in claim 10, further comprising a semiconductor substrate containing a plurality of photodiodes formed therein, wherein the semiconductor substrate has an absorption band, the first filter layer is an IR pass filter, the second filter layer is a partial IR cut-off filter, and the partial IR cut-off filter has a cut-off region from the fourth wavelength to the second wavelength, the fourth wavelength is the wavelength of the specific band of the IR light of the light source unit plus 10 nm to 50 nm, and the second wavelength is a longest wavelength of the absorption band of the semiconductor substrate.

13. The image sensor as claimed in claim 10, wherein the IR filter comprises a selective IR filter, the selective IR filter cuts off IR light of a specific wavelength, and the specific wavelength of the IR light cut off by the selective IR filter is consistent with the wavelength of the specific band of the IR light of the light source unit.

14. The image sensor as claimed in claim 9, wherein the R, G and B filters are disposed above the IR filter.

15. The image sensor as claimed in claim 9, wherein the R, G and B filters are disposed underneath the IR filter.

16. The image sensor as claimed in claim 9, wherein the light to be transmitted through the first filter layer has a transmittance of 50% at a fifth wavelength, the light to be transmitted through the second filter layer has a transmittance of 50% at a sixth wavelength, and the fifth wavelength is lower than the sixth wavelength.

17. The image sensor as claimed in claim 9, wherein the first and second filter layers are combined to form a double-layered stacked absorption-type filter.

18. The image sensor as claimed in claim 9, wherein the second filter layer is disposed above the first filter layer.

19. The image sensor as claimed in claim 9, wherein the second filter layer is disposed underneath the first filter layer.

20. The image sensor as claimed in claim 9, further comprising a semiconductor substrate containing a plurality of photodiodes formed therein, wherein each of the photodiodes is disposed at one pixel of the R, G and B pixels and the IR pixel, the photodiodes at the R, G and B pixels receive visible light having passed through the R, G and B filters and the IR filter for acquiring color image information of an object, and the photodiode at the IR pixel receives IR light having passed through the stacked filter for acquiring distance information of the object, and a three-dimensional (3D) color image of the object is obtain from a single sensor.

* * * * *